US005649346A

United States Patent [19]

Katsuumi et al.

[11] Patent Number: 5,649,346

[45] Date of Patent: Jul. 22, 1997

[54] MANUFACTURING METHOD FOR INK JET PRINTER HEAD

[75] Inventors: Kazushige Katsuumi, Shizuoka; Toshio Miyazawa, Mishima; Toshihilo Tsukamoto, Gotenba, all of Japan

[73] Assignees: Kabushiki Kaisha TEC, Shizuoka; Toshiba-EMI Limited, Tokyo, both of Japan

[21] Appl. No.: 593,520

[22] Filed: Jan. 30, 1996

[30] Foreign Application Priority Data

| | | | |
|---|---|---|---|
| Jan. 31, 1995 | [JP] | Japan | 7-014140 |
| Dec. 15, 1995 | [JP] | Japan | 7-327133 |

[51] Int. Cl.$^{6}$ .................... H01L 41/22

[52] U.S. Cl. .................... 29/25.35; 29/890.1; 310/333; 347/71

[58] Field of Search .................... 29/25.35, 890.1; 205/127, 300, 301; 310/333, 345, 363, 364; 347/68, 71, 72; 427/100, 125, 126.5

[56] References Cited

U.S. PATENT DOCUMENTS

| | | | |
|---|---|---|---|
| 5,301,404 | 4/1994 | Ochiai et al. | 29/25.35 |
| 5,311,218 | 5/1994 | Ochiai et al. | 347/71 |
| 5,311,219 | 5/1994 | Ochiai et al. | 310/333 X |
| 5,327,627 | 7/1994 | Ochiai et al. | 29/25.35 |

FOREIGN PATENT DOCUMENTS

| | | | |
|---|---|---|---|
| 1188348 | 7/1989 | Japan | 29/890.1 |
| 1188349 | 7/1989 | Japan | 29/890.1 |
| 4-363250 | 12/1992 | Japan . | |
| 5000513 | 1/1993 | Japan | 29/890.1 |
| 5-96727 | 4/1993 | Japan . | |
| 5147215 | 6/1993 | Japan | 29/25.35 |
| 5-269994 | 10/1993 | Japan . | |
| 5269995 | 10/1993 | Japan | 347/71 |

*Primary Examiner*—Peter Vo

*Attorney, Agent, or Firm*—Oblon, Spivak, McClelland, Maier & Neustadt, P.C.

[57] ABSTRACT

A manufacturing method for an ink jet printer head, includes the steps of: cutting a plurality of channels for forming a plurality of ink chambers, on the upper surface of a substrate composed of a plurality of layers including at least one piezoelectric member polarized across its thickness; forming a pattern resist film covering a portion of the upper surface of the substrate except electrode forming portions on the inner surfaces of the channels and wiring pattern forming portions on the substrate; performing a process for adsorption of Pd on the electrode forming portions and the wiring pattern forming portions after forming the pattern resist film, for example, by performing a sensitizing process of adsorbing Sn on the substrate and next substituting Pd for the Sn, or by performing a catalyzing process of adsorbing a complex compound of Pd on the substrate and next performing an accelerating process of metallizing the complex compound of Pd; separating the pattern resist film; immersing the substrate from which the pattern resist film has been separated into a plating liquid for forming electrodes and wiring patterns; and mounting on the substrate a top plate and a nozzle plate to form the above ink chambers.

13 Claims, 9 Drawing Sheets

MANUFACTURING METHOD FOR INK JET PRINTER HEAD

BACKGROUND OF THE INVENTION

1. Field of the Invention

The present invention relates to a manufacturing method for an ink jet printer head of an on-demand type such that ink droplets are discharged by utilizing deformation of a piezoelectric member and, more particularly, to such a manufacturing method characterized in pretreatment for formation of electrodes and wiring patterns thereof for applying electric power to the piezoelectric member.

2. Description of the Prior Art

Conventionally known are various ink jet printer heads of a so-called on-demand type such that ink droplets are discharged in accordance with a print command. A known example of such ink jet printer heads is one designed to discharge ink droplets by utilizing deformation of a piezoelectric member upon application of electric power thereto. Such an ink jet printer head is disclosed in Japanese Patent Laid-open No. Hei 4-363250 (corresponding to U.S. Pat. No. 5,311,218), Japanese Patent Laid-open No. Hei 5-96727 (corresponding to U.S. Pat. No. 5,311,219), and Japanese Patent Laid-open No. Hei 5-269994 (corresponding to U.S. Pat. No. 5,301,404), for example. The structure of the ink jet printer head disclosed in Japanese Patent Laid-open Nos. Hei 5-96727 and Hei 5-269994 will now be described with reference to FIGS. 9(A) to 11(C) showing the sequence of steps of manufacturing the ink jet printer head.

As shown in FIG. 9(A), a substrate 4 having a three-layer structure consisting of a bottom plate 1, a lower layer 2, and a piezoelectric member 3 is formed in the first step. The bottom plate 1 is formed of a highly rigid and less thermally deformable material such as ceramics or glass. The lower layer 2 is formed by applying an adhesive primarily composed of an epoxy resin to the upper surface of the bottom plate 1 to form an adhesive layer having a given thickness, and then curing the adhesive layer. The piezoelectric member 3 is bonded to the lower layer 2 in such a manner that the direction of polarization of the piezoelectric member 3 accords with the direction of thickness of the piezoelectric member 3. In forming the lower layer 2, the thickness thereof is adjusted by grinding the adhesive layer after curing it.

As shown in FIG. 9(B), the substrate 4 is next cut to form a plurality of parallel channels 5 at given intervals, each channel 5 having a depth ranging from the upper surface of the piezoelectric member 3 to the interior of the lower layer 2. By this cutting work of the substrate 4, a plurality of side walls 6 are simultaneously formed so that adjacent ones of them are located on the opposite sides of each channel 5. Each side wall 6 consists of an upper side wall 6(A) formed from the piezoelectric member 3 and a lower side wall 6(B) formed from the lower layer 2.

Next, the substrate 4 is subjected to electroless plating for forming electrodes 7 and wiring patterns 8 (see FIG. 11(A)). As a pretreatment for the electroless plating, a catalyzing/accelerating process is performed. The catalyzing process is performed by immersing the substrate 4 into a catalyst liquid containing palladium chloride ($PdCl_2$), stannous chloride ($SnCl_2$), and concentrated hydrochloric acid (HCl) to adsorb a complex compound of Pd and Sn on the inner surfaces of the channels 5 and the upper surface of the piezoelectric member 3. The accelerating process is performed to convert the complex compound adsorbed by the catalyzing process into a catalyst. By this process, the complex compound is converted into metallized Pd as a catalyst core.

As shown in FIG. 9(C), a dry film 9 is next attached to the upper surface of the piezoelectric member 3. Then, as shown in FIG. 10(A), a resist mask 10 is placed on the dry film 9 to perform exposure and development. As a result, as shown in FIG. 10(B), a pattern resist film 11 is formed on the upper surface of the piezoelectric member 3 from the dry film 9 so as to cover channel inside surfaces *7a* as electrode forming portions on which the electrodes 7 are to be formed later and wiring pattern forming portions *8a* on which the wiring patterns 8 are to be formed later. At this time, the metallized Pd is exposed to the channel inside surfaces *7a* and the wiring pattern forming portions *8a*, and the other Pd adsorbed on the upper surface of the piezoelectric member 3 is covered with the pattern resist film 11.

Next, the substrate 4 on which the pattern resist film 11 has been formed is immersed into a plating liquid to perform electroless plating. The plating liquid to be used is a low-temperature plating liquid containing nickel and phosphorus. When the substrate 4 on which the pattern resist film 11 has been formed is immersed into the plating liquid, the metallized Pd in the exposed condition acts as a catalyst core to deposit plating on the channel inside surfaces *7a* and the wiring pattern forming portions *8a*. As a result, the electrodes 7 are formed on the channel inside surfaces *7a*, and the wiring patterns 8 are formed on the wiring pattern forming portions *8a* as shown in FIG. 11(A). Then, as shown in FIG. 11(B), the pattern resist film 11 is separated to thereby finish the electroless plating.

Next, as shown in FIG. 11(C), a top plate 12 is bonded to the substrate 4 so as to cover the upper openings of the channels 5, and a nozzle plate 14 having a plurality of ink discharge openings 13 respectively communicating with the front openings of the channels 5 is then bonded to the substrate 4 and the top plate 12 so as to cover the front openings of the channels 5. Further, an ink supply pipe 15 for supplying ink to the channels 5 is mounted to the top plate 12, thereby completing an ink jet printer head 16. Thus, the channels 5 are surrounded by the top plate 12 and the nozzle plate 14 to thereby form a plurality of ink chambers. In bonding the nozzle plate 14, the front end surfaces of the substrate 4 and the top plate 12 are cut to be made flush.

In manufacturing the ink jet printer head 16 disclosed in Japanese Patent Laid-open Nos. Hei 5-96727 and Hei 5-269994, the electrodes 7 and the wiring patterns 8 are formed by the above-mentioned steps, in which the electrodes 7 having no pinholes can be formed on the channel inside surfaces *7a*. However, the prior art ink jet printer head 16 has the following problems.

The first problem will now be described. In immersing the substrate 4 on which the pattern resist film 11 has been immersed into the plating liquid, so as to form the electrodes 7 and the wiring patterns 8 by electroless plating, there is a case where the pattern resist film 11 is swelled by the plating liquid, and in particular, portions of the pattern resist film 11 covering the upper end surfaces of the side walls 6 are floated or separated by the plating liquid. If the pattern resist film 11 is thus floated or separated from the upper end surfaces of the side walls 6, the Pd covered with the pattern resist film 11 is exposed to act as a catalyst core for electroless plating, thereby depositing plating on the upper end surfaces of the side walls 6. As a result, the adjacent electrodes 7 formed on the channel inside surfaces *7a* are short-circuited in some case. This defect is due to the following reason. In attaching the dry film 9 to the upper surface of the piezoelectric member 3 with good adhesion, it is desired to enough harden the dry film 9 at a baking temperature of 150° C. or higher. To the contrary, when the piezoelectric member 3 polarized is heated to 130° C. or higher, deterioration of polarization in the piezoelectric member 3 occurs. Accordingly, the baking temperature must be suppressed to about 130° C. As a result, the pattern resist film 11 is not enough hardened because of the low baking temperature of about 130° C., causing ready swelling of the pattern resist film 11 immersed into the plating liquid.

The second problem will next be described. Just before depositing the plating by electroless plating, a hydrophilic process for the substrate 4 is usually performed with an ethanol liquid or an activating agent to improve the deposition of the plating on the channel inside surfaces 7*a*. Although not described in the prior art shown in FIGS. 9(A) to 11(C), the hydrophilic process activates the surface of the pattern resist film 11. However, when the hydrophilic process is performed, there is a case where the Pd adsorbed on the channel inside surfaces 7*a* and the wiring pattern forming portions 8*a* is partially separated and the Pd thus separated is partially deposited to the activated surface of the pattern resist film 11. As a result, when the substrate 4 in this condition is immersed into the plating liquid to deposit the plating, the plating is undesirably deposited also to the surface of the pattern resist film 11 on which the plating must not be deposited, so that the plating deposited on the surface of the pattern resist film 11 continues to the electrodes 7 and the wiring patterns 8. Accordingly, in separating the pattern resist film 11, the electrodes 7 and the wiring patterns 8 are partially pulled to be separated in some case.

The third problem will now be described. While the resist mask 10 is placed on the dry film 9 attached to the upper surface of the piezoelectric member 3, and exposure and development are performed with respect to the dry film 9 to thereby form the pattern resist film 11, it is difficult to accurately form a pattern of the pattern resist film 11 into a desired shape. That is, the pattern resist film 11 is formed by placing the resist mask 10 having a predetermined pattern on the dry film 9, and next directing light for the exposure onto the dry film 9 through the resist mask 10. However, since the upper surface of the piezoelectric member 3 on which the dry film 9 is attached has microscopic asperities, there occurs irregular reflection of the exposure light on the microscopic asperities. The exposure light thus irregularly reflected undesirably sensitizes a portion of the dry film 9 masked by the resist mask 10. Accordingly, the width of the pattern of the pattern resist film 11 becomes different from the width of the pattern described in the resist mask 10. Further, an edge portion of the pattern resist film 11 becomes remarkably dull.

While the third problem may be solved by mirror-finishing the upper surface of the piezoelectric member 3 to remove the asperities, this work is costly and therefore unpractical.

SUMMARY OF THE INVENTION

It is accordingly an object of the present invention to provide a manufacturing method for an ink jet printer head, which can manufacture electrodes and wiring patterns with high accuracy by electroless plating.

It is another object of the present invention to provide a manufacturing method for an ink jet printer head, which can prevent such inconvenience that in performing exposure and development with respect to a dry film provided on the upper surface of a piezoelectric member to form a pattern resist film, light for the exposure may be irregularly reflected on the rough surface of the piezoelectric member to undesirably sensitize a portion of the dry film masked by a resist mask, thereby forming the pattern resist film faithfully following a pattern of the resist mask.

The manufacturing method for the ink jet printer head according to the present invention comprises the steps of: forming a substrate composed of a plurality of layers including at least one piezoelectric member polarized across its thickness; forming a plurality of parallel channels and a plurality of side walls isolating the channels at given intervals from an upper surface of the substrate, at least a part of each of the side walls being formed from the piezoelectric member; forming a pattern resist film on the upper surface of the substrate so that the pattern resist film covers a portion of the upper surface of the substrate except electrode forming portions on inner surfaces of the channels and wiring pattern forming portions on the substrate; performing a process for adsorption of Pd on the electrode forming portions and the wiring pattern forming portions after forming the pattern resist film, for example, by performing a sensitizing process of adsorbing Sn on the substrate and next performing an activation process of substituting the Pd for the Sn, or by performing a catalyzing process of adsorbing a complex compound of Pd on the substrate and next performing an accelerating process of metallizing the complex compound of Pd, thereby adsorbing the Pd as a catalyst core for electroless plating; separating the pattern resist film; immersing the substrate from which the pattern resist film has been separated into a plating liquid to deposit plating on the electrode forming portions and the wiring pattern forming portions, thereby forming electrodes and wiring patterns; and mounting on the substrate a top plate for covering upper openings of the channels and a nozzle plate for covering front openings of the channels to form a plurality of ink chambers. According to this method, the substrate is immersed into the plating liquid to perform electroless plating after separating the pattern resist film. Accordingly, there is no possibility of swelling of the pattern resist film and separation of the pattern resist film swelled due to the immersion of the substrate into the plating liquid. Further, in depositing the plating, the Pd as a catalyst core is preliminarily adsorbed only at the electrode forming portions and the wiring pattern forming portions, and the plating is deposited only at the electrode forming portions and the wiring pattern forming portions. Accordingly, there is no possibility that the plating may be deposited between the adjacent electrodes to cause short-circuit. Further, even if the Pd adsorbed on the electrode forming portions and the wiring pattern forming portions is partially separated off in performing a hydrophilic treatment just before immersing the substrate from which the pattern resist film has been separated into the plating liquid, there is no possibility that the Pd separated off may be deposited to the upper surface of the piezoelectric member, because a portion of the upper surface of the piezoelectric member on which Pd is not adsorbed is not activated by the hydrophilic treatment. Accordingly, there is no possibility that the plating may be deposited on this portion of the upper surface of the piezoelectric member other than the electrode forming portions and the wiring pattern forming portions on which the Pd is previously deposited. As a result, the possibility of short-circuit due to deposition of plating between the adjacent electrodes can be prevented.

DETAILED DESCRIPTION OF THE PREFERRED EMBODIMENTS

Figure 1:
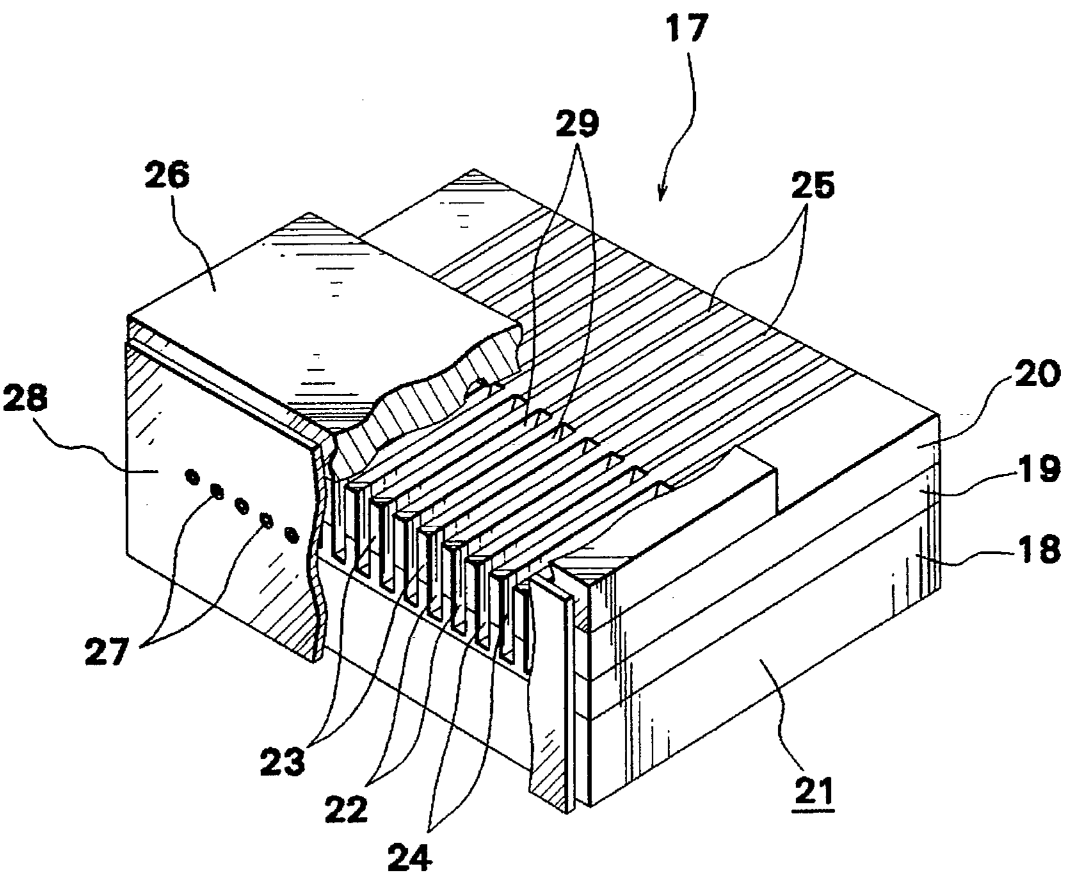
FIG. 1 is a partially cutaway, perspective view of an ink jet printer head in a first preferred embodiment according to the present invention.

A first preferred embodiment of the present invention will now be described with reference to FIGS. 1 to 5. FIG. 1 is a partially cutaway, perspective view showing the structure of the whole of an ink jet printer head 17 according to the present invention. The ink jet printer head 17 includes a substrate 21 consisting of a bottom plate 18, a lower layer 19, and a piezoelectric member 20. The substrate 21 includes a plurality of channels 22 and side walls 23 adjacent ones of which are located on the opposite sides of each channel 22. The channels 22 and the side walls 23 are formed by cutting the substrate 21. A plurality of electrodes 24 and a plurality of wiring patterns 25 are formed on the substrate 21 having the channels 22 and the side walls 23 by electroless plating. A top plate 26 and a nozzle plate 28 having a plurality of ink discharge openings 27 are bonded to the substrate 21 after forming the electrodes 24 and the wiring patterns 25. Thus, the channels 22 are surrounded by the top plate 26 and the nozzle plate 28 to thereby form a plurality of ink chambers 29.

Figure 2A:
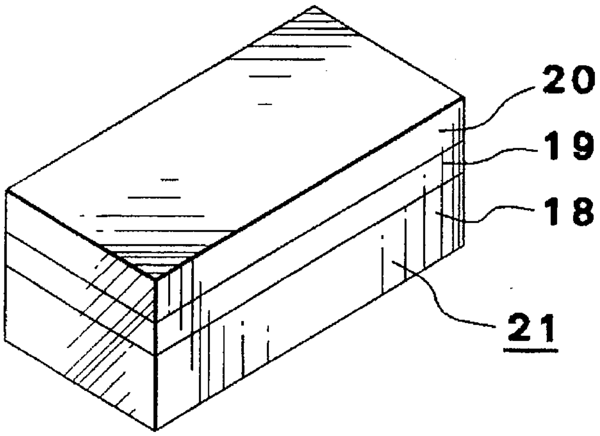
FIG. 2(A) is a perspective view of a substrate.

The structure of the ink jet printer head 17 will now be described in detail with reference to FIGS. 2(A) to 4(C) showing the sequence of steps of manufacturing the ink jet printer head 17. As shown in FIG. 2(A), the substrate 21 having a three-layer structure consisting of the bottom plate 18, the lower layer 19, and the piezoelectric member 20 is formed in the first step. The bottom plate 18 is formed of a highly rigid and less thermally deformable material such as ceramics or glass. The lower layer 19 is formed by applying an adhesive primarily composed of an epoxy resin to the upper surface of the bottom plate 18 to form an adhesive layer having a given thickness, and then curing the adhesive layer. The piezoelectric member 20 is bonded to the lower layer 19 in such a manner that the direction of polarization of the piezoelectric member 20 accords with the direction of thickness of the piezoelectric member 20. In forming the lower layer 19, the thickness thereof is adjusted by grinding the adhesive layer after curing it.

Figure 2B:
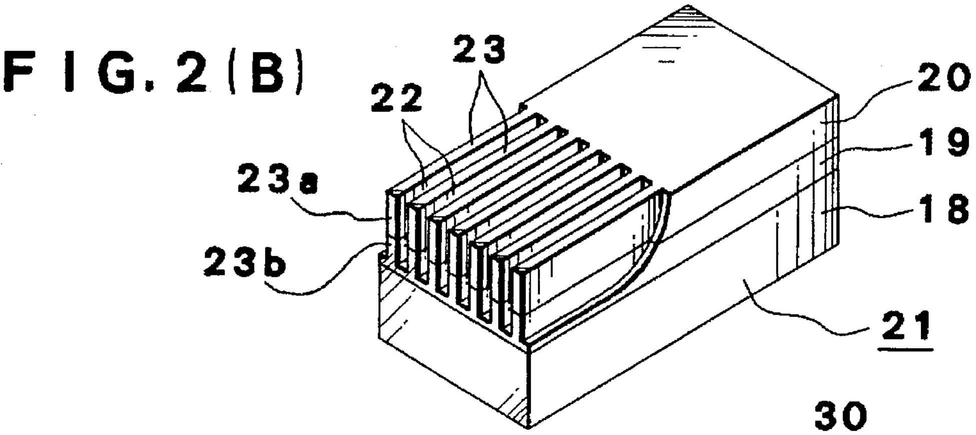
FIG. 2(B) is a perspective view showing a condition where the substrate is cut to form channels.

As shown in FIG. 2(B), the substrate 21 is next cut to form the plural parallel channels 22 at given intervals, each channel 22 having a depth ranging from the upper surface of the piezoelectric member 20 to the interior of the lower layer 19, and simultaneously form the plural parallel side walls 23, adjacent ones of which are located on the opposite sides of each channel 22. Each channel 22 has a width of 100 μm. Accordingly, each side wall 23 consists of an upper side wall 23*a* formed from the piezoelectric member 20 and a lower side wall 23*b* formed from the lower layer 19. The substrate 21 formed with the channels 22 and the side walls 23 is first subjected to ultrasonic washing for removing chips generated in cutting the substrate 21 and ultrasonic washing using an organic solvent such as ethanol for making the inside of the channels 22 hydrophilic. Thereafter, the substrate 21 is enough washed with water and then dried.

Figure 2C:
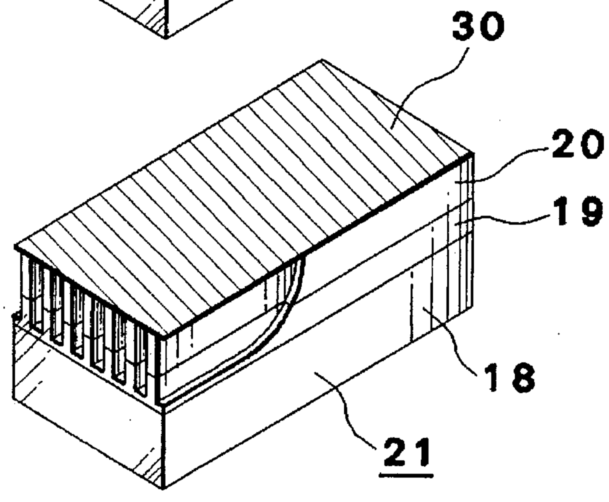
FIG. 2(C) is a perspective view showing a condition where a dry film is attached to the upper surface of the substrate.
Figure 3A:
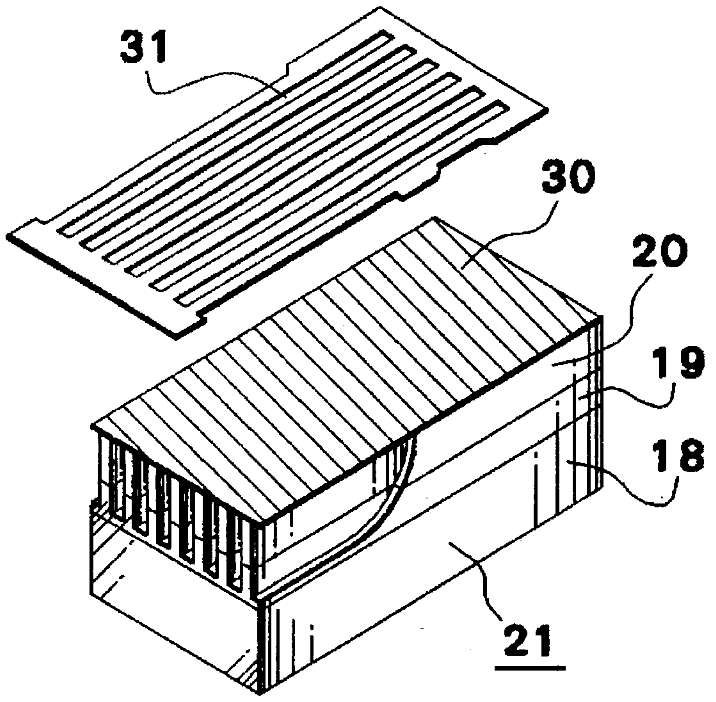
FIG. 3(A) is a perspective view showing the substrate on which the dry film has been attached and a resist mask to be placed on the dry film.
Figure 3B:
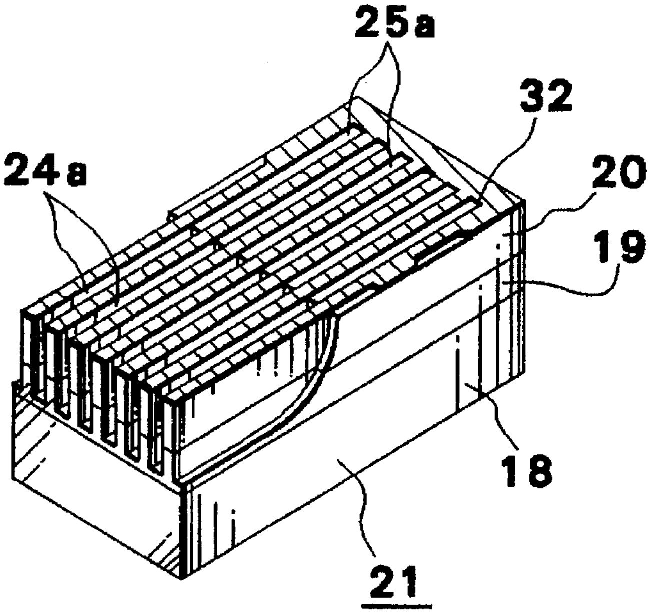
FIG. 3(B) is a perspective view showing a condition where a pattern resist film is formed on the upper surface of the substrate from the dry film.
Figure 4:
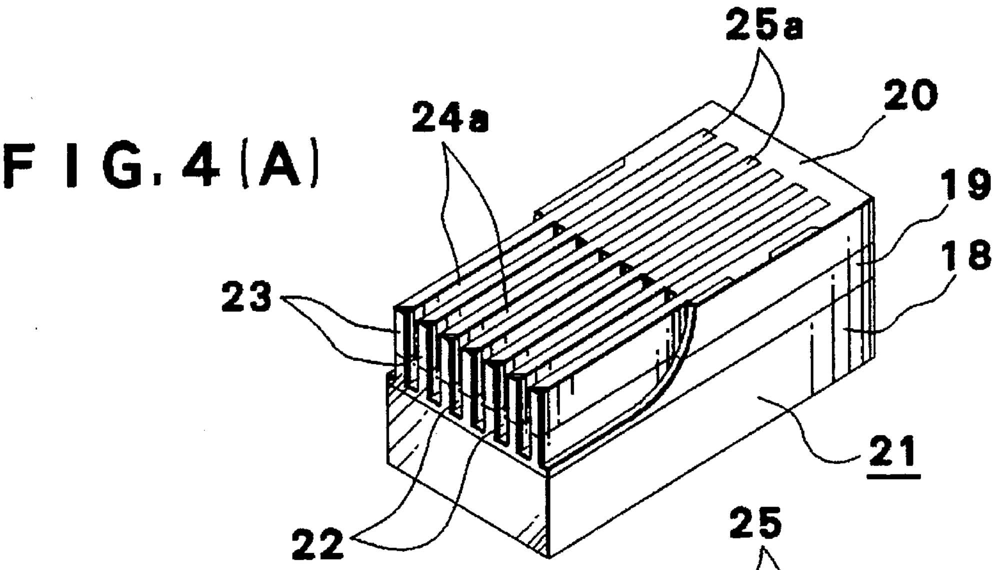
FIG. 4(A) is a perspective view showing a condition where the pattern resist film has been separated.
FIG. 4(B) is a perspective view showing a condition where wiring patterns and electrodes are formed by electroless plating.
FIG. 4(C) is a perspective view showing a condition where a top plate and a nozzle plate are mounted on the substrate to complete the ink jet printer head.
Figure 4:
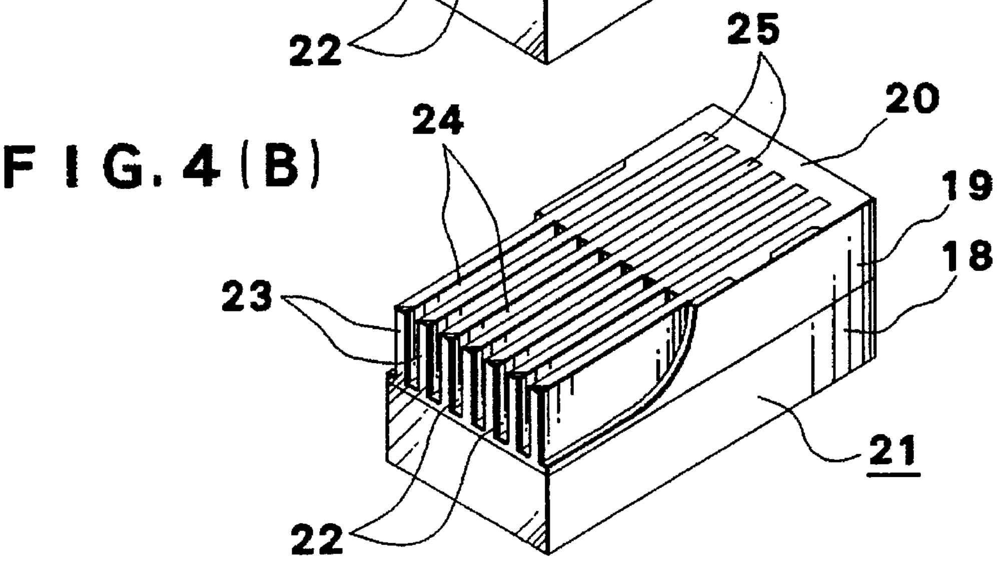
Figure 4:
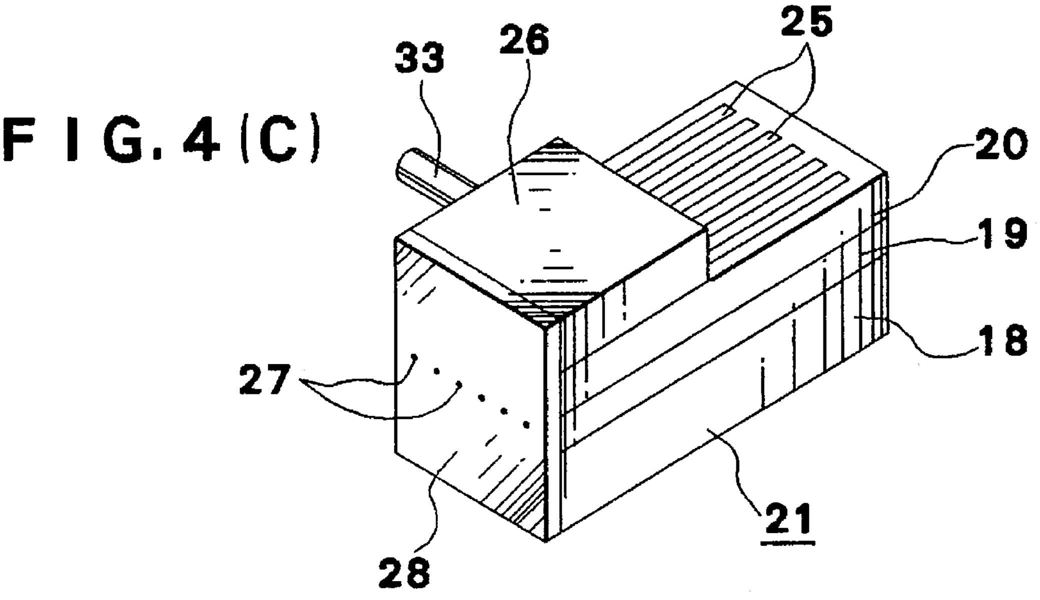
Figure 10A:
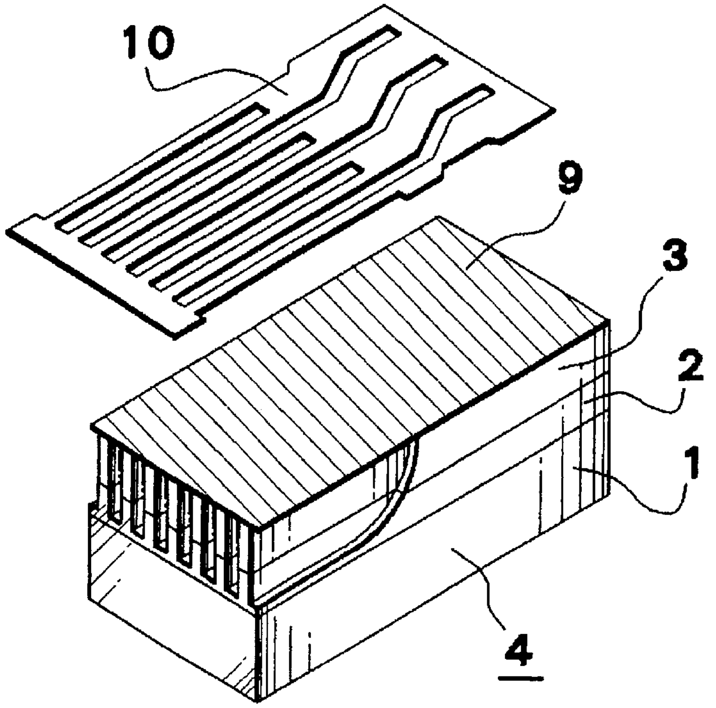
FIG. 10(A) PRIOR ART
FIG. 10(A) is a perspective view showing the substrate to which the dry film has been attached and a resist mask to be placed on the dry film.
Figure 10B:
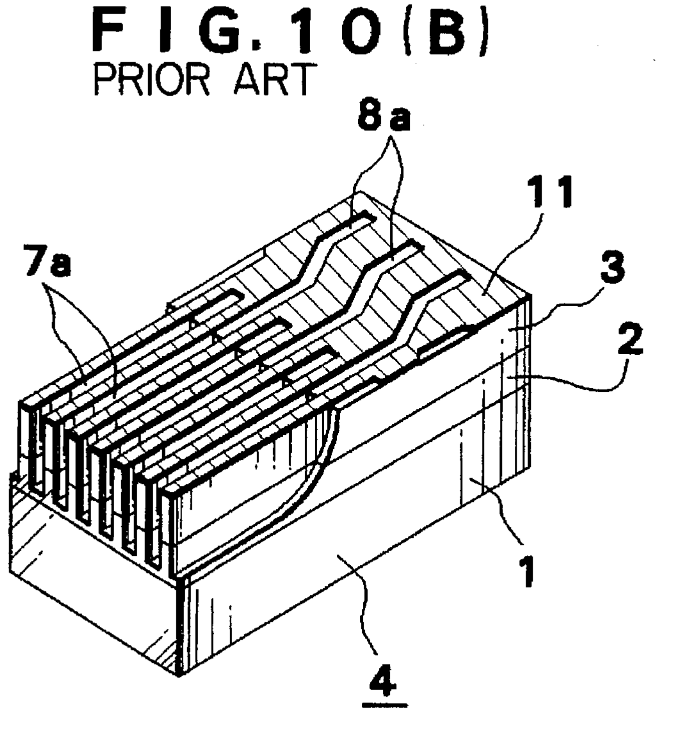
FIG. 10(B) PRIOR ART
FIG. 10(B) is a perspective view showing a condition where a pattern resist film is formed on the upper surface of the substrate from the dry film.
Figure 11:
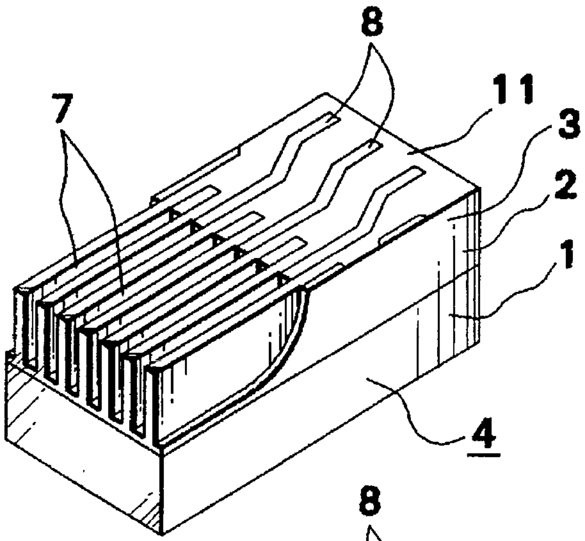
FIG. 11 (A) PRIOR ART
FIG. 11(A) is a perspective view showing a condition where wiring patterns and electrodes are formed by electroless plating.
FIG. 11(B) is a perspective view showing a condition where the pattern resist film has been separated.
FIG. 11(C) is a perspective view showing a condition where a top plate and a nozzle plate are mounted on the substrate to complete the ink jet printer head in the prior art.
Figure 11:
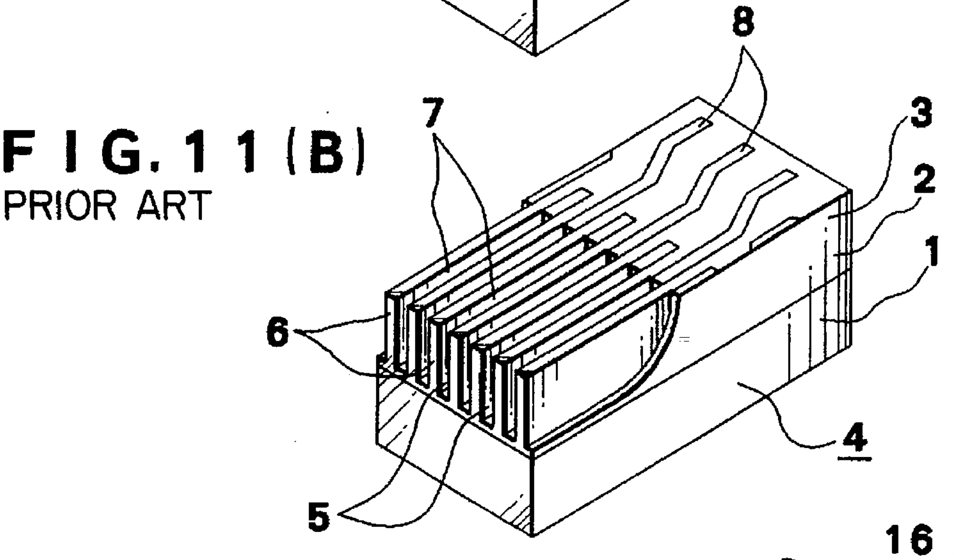
FIG. 11 (B) PRIOR ART
Figure 11:
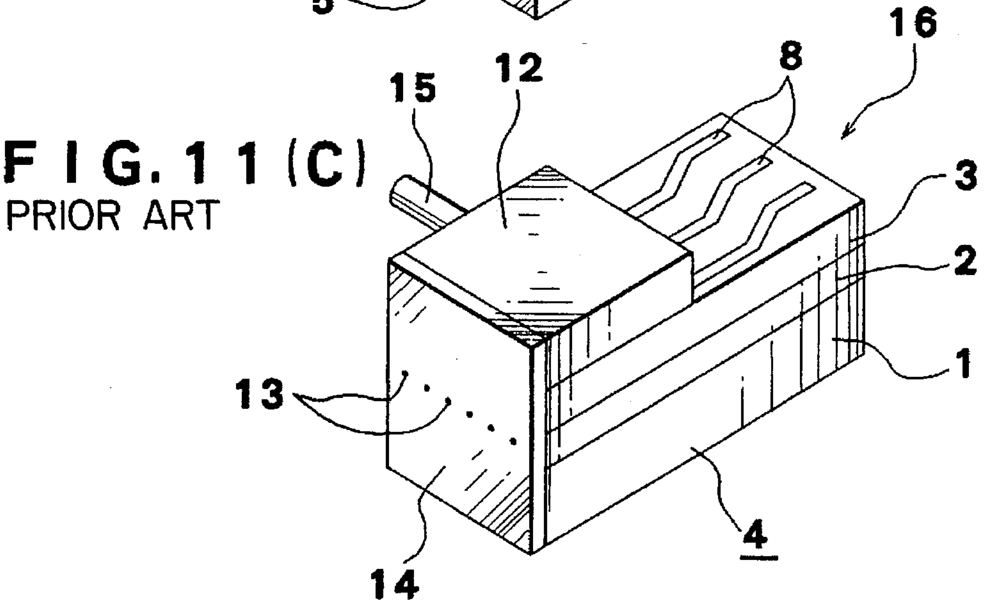
FIG. 11 (C) PRIOR ART

As shown in FIG. 2(C), a dry film 30 is next attached to the upper surface of the piezoelectric member 20, and as shown in FIG. 3(A), a resist mask 31 is next placed on the dry film 30 to perform exposure and development. The resist mask 31 has a pattern for forming a wiring patterns 25 described below in width of 100 μm. As a result, as shown in FIG. 3(B), a pattern resist film 32 is formed on the upper surface of the piezoelectric member 20 so as to cover a portion of the upper surface of the piezoelectric member 20 except channel inside surfaces 24*a* as electrode forming portions and wiring pattern forming portions 25*a*. In comparing FIG. 3(B) in this preferred embodiment and FIG. 10(B) in the prior art, the two figures are similar to each other in appearance, but they are different in the point that in the substrate 4 shown in FIG. 10(B), metallized Pd as a catalyst core is adsorbed on the surface of the piezoelectric member 3 (including the inner surfaces of the channels 5) by the catalyzing/accelerating process, whereas in the substrate 21 shown in FIG. 3(B), metallized Pd as a catalyst core is not adsorbed on the surface of the piezoelectric member 20.

Next, a sensitizing/activation process is performed as a pretreatment for electroless plating. The sensitizing process is performed by immersing the substrate 21 having the pattern resist film 32 into a sensitizing liquid. By this process, Sn is adsorbed on a portion of the surface of the substrate 21 exposed from the pattern resist film 32, that is, on the channel inside surfaces 24*a* and the wiring pattern forming portions 25*a*. The sensitizing liquid to be used herein is a mixture liquid of $SnF_2$+HF, a mixture liquid of $HBF_4$+$SnF_2$, or a mixture liquid of $SnCl_2$+HCl, for example. The activation process to be performed subsequent to the sensitizing process consists of a first stage of process and a second stage of process. The first stage of process is performed by immersing the substrate 21 on which the Sn has already been adsorbed into a liquid containing silver nitrate (e.g., a solution of $AgNO_3$) to thereby substitute Ag for the Sn. The second stage of process is performed by immersing the substrate 21 treated by the first stage of process into a liquid containing palladium chloride (e.g., a solution of $PdCl_2$+HCl) to thereby substitute Pd for the Ag. Thus, by the activation process of two stages, Pd as a catalyst core for electroless plating is adsorbed on the channel inside surfaces 24*a* and the wiring pattern forming portions 25*a*.

After performing the sensitizing/activation process mentioned above, the pattern resist film 32 is separated from the substrate 21 as shown in FIG. 4(A). Next, the substrate 21 from which the pattern resist film 32 has been separated is immersed into an ethanol liquid to perform a hydrophilic treatment, so as to facilitate entry of a plating liquid into the channels 22. After the hydrophilic treatment, the substrate 21 is immersed into the plating liquid to perform electroless plating.

In performing the electroless plating, plating is not deposited on a portion of the surface of the substrate 21 where the pattern resist film 32 has been separated, because Pd is absent on this portion, whereas plating is deposited only on the channel inside surfaces 24*a* and the wiring pattern forming portions 25*a* where metallized Pd is adsorbed. Accordingly, as shown in FIG. 4(B), the electrodes 24 and the wiring patterns 25 are formed on the channel inside surfaces 24*a* and the wiring pattern forming portions 25*a* with width of 100 μm, respectively. In an example of the preferred embodiment, a low-temperature plating liquid containing nickel and phosphorus was used as the plating liquid, and the surface of the piezoelectric member 20 was roughened by using particles having a size of 2 to 4 μm and subjected to electroless plating. As the result, a uniform nickel plating film having a thickness of 1 to 2 μm with no pinholes was formed on the surface of the piezoelectric member 20.

Next, the top plate 26 and the nozzle plate 28 are bonded to the substrate 21 having the electrodes 24 and the wiring patterns 25, and an ink supply pipe 33 is mounted to the assembly, thereby completing the ink jet printer head 17 as shown in FIG. 4(C).

Figure 5:
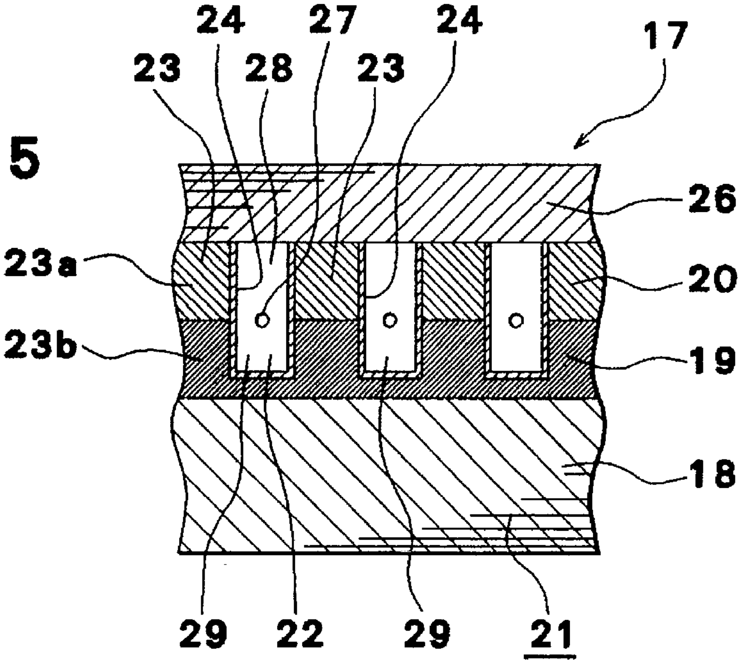
FIG. 5 is a vertical sectional, front view of the ink jet printer head.

FIG. 5 is a vertical sectional view of the ink jet printer head 17 thus completed. In the ink jet printer head 17, when electric power is applied to the electrodes 24, the upper side walls 23*a* formed from the piezoelectric member 20 are deformed and the lower side walls 23*b* are also deformed as following the upper side walls 23*a*. The deformation of the side walls 23 causes a change in volume of the ink chambers 29, and this change in volume of the ink chambers 29 causes ejection of the ink from the ink discharge openings 27 of the nozzle plate 28, thus effecting a print operation.

According to this preferred embodiment, before immersing the substrate 21 into the plating liquid to perform the electroless plating, the pattern resist film 32 is separated from the substrate 21. Accordingly, there is no possibility that the pattern resist film 32 may be swelled or separated off by the immersion into the plating liquid. Even when the electroless plating is performed in the condition where the pattern resist film 32 is separated from the substrate 21, the plating can be deposited only on the channel inside surfaces 24*a* and the wiring pattern forming portions 25*a* because Pd as a catalyst core for electroless plating is adsorbed only on the channel inside surfaces 24*a* and the wiring pattern forming portions 25*a*. Accordingly, there is no possibility of short-circuit between the adjacent electrodes 24 due to deposition of plating therebetween.

Further, the surface of the piezoelectric member 20 is not activated by the hydrophilic treatment using an ethanol liquid to be performed just before immersing the substrate 21 into the plating liquid. Accordingly, even if the Pd adsorbed on the channel inside surfaces 24*a* and the wiring pattern forming portions 25*a* is partially separated off by the hydrophilic treatment, there is no possibility that the Pd separated off may be deposited to the surface of the piezoelectric member 20. Accordingly, plating is prevented from being deposited to a portion of the surface of the substrate 21 except the channel inside surfaces 24*a* and the wiring pattern forming portions 25*a* because of the hydrophilic treatment to be performed just before the electroless plating. As a result, it is possible to prevent short-circuit between the adjacent electrodes 24 due to unnecessary deposition of plating.

Although the adsorption of Pd as a catalyst core for electroless plating is effected by the sensitizing/activation process in this preferred embodiment, it may be effected by a catalyzing/accelerating process. In this case, the pattern resist film 32 is formed before performing the accelerating process to metallize Pd, and the pattern resist film 32 is separated after metallizing the Pd and before immersing the substrate 21 into the plating liquid.

Figure 6A:
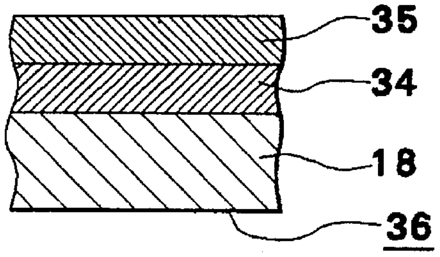
FIG. 6(A) is a vertical sectional, rear view of a substrate in a second preferred embodiment according to the present invention.
Figure 6B:
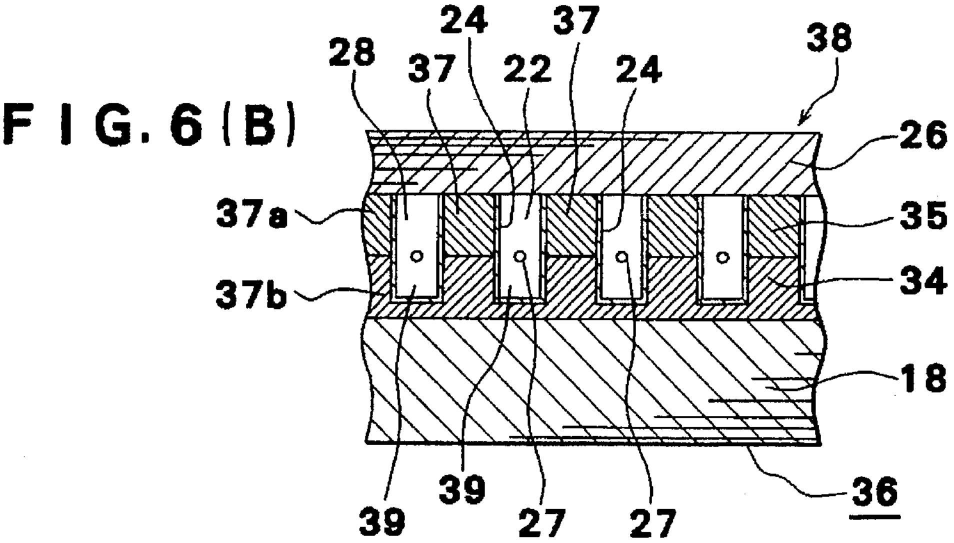
FIG. 6(B) is a vertical sectional, front view of an ink jet printer head in the second preferred embodiment.

A second preferred embodiment of the present invention will now be described with reference to FIGS. 6(A) and 6(B), in which the same parts as those in FIGS. 1 to 5 are denoted by the same reference numerals and the description thereof will be omitted herein (the same applies to the subsequent preferred embodiments). In the second preferred embodiment, a substrate 36 is formed by bonding two layers of piezoelectric members 34 and 35 on a bottom plate 18. The substrate 36 is cut to form a plurality of channels 22 and side walls 37, and is subsequently subjected to electroless plating to form electrodes 24 and wiring patterns 25. Further, a top plate 26 and a nozzle plate 28 are bonded to the substrate 36 having the electrodes 24 and the wiring patterns 25 to form an ink jet printer head 38. The channels 22 are surrounded by the top plate 26 and the nozzle plate 28 to form a plurality of ink chambers 39. The piezoelectric members 34 and 35 are preliminarily polarized across their thickness, and they are bonded together in such a manner that the directions of polarization of them are opposite to each other.

When electric power is applied to the electrodes 24 to effect printing by the ink jet printer head 38, an upper side wall 37*a* and a lower side wall 37*b* of each side wall 37 respectively formed from the upper and lower piezoelectric members 35 and 34 are deformed in the same direction to cause a change in volume of the ink chambers 39. The change in volume of the ink chambers 39 causes ejection of ink droplets from ink discharge openings 27 of the nozzle plate 28. In the ink jet printer head 38 of the second preferred embodiment, the upper side wall 37*a* and the lower side wall 37*b* of each side wall 37 are formed from the piezoelectric members 35 and 34, respectively. Accordingly, the upper side wall 37*a* and the lower side wall 37*b* are deformed in the same direction upon application of electric power. As a result, as compared with the ink jet printer head 17 of the first preferred embodiment, the amount of deformation of each side wall 37 as a whole can be made greater, so that the rate of change in volume of the ink chambers 39 can be made greater. As a result, a high printing speed can be attained, and the electric power to be applied can be saved.

Figure 7:
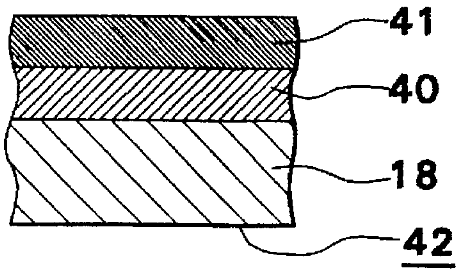
FIG. 7(A) is a vertical sectional, rear view of a substrate in a third preferred embodiment according to the present invention.
FIG. 7(B) is a vertical sectional, front view of an ink jet printer head in the third preferred embodiment.
Figure 7:
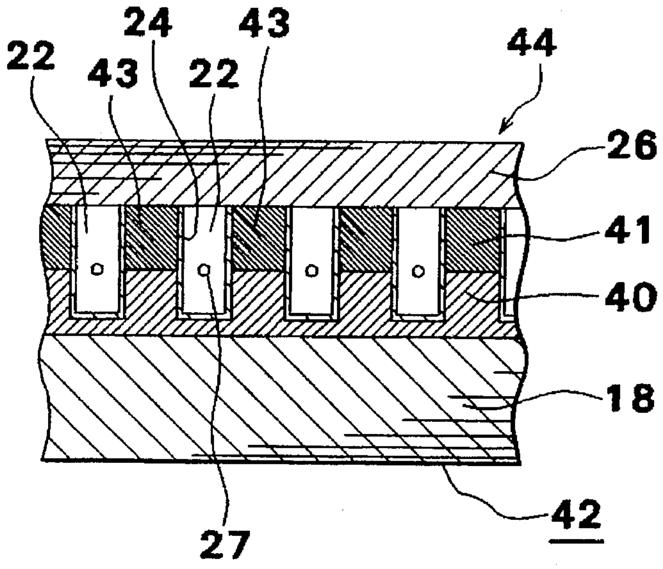

A third preferred embodiment of the present invention will now be described with reference to FIGS. 7(A) and 7(B). In this preferred embodiment, a piezoelectric member 40 polarized across its thickness is bonded to the upper surface of a bottom plate 18, and an upper layer 41 is formed on the upper surface of the piezoelectric member 40 by hardening an adhesive primarily composed of an epoxy resin. Thus, the bottom plate 18, the piezoelectric member 40, and the upper layer 41 form a substrate 42.

The substrate 42 is cut to form a plurality of channels 22 and side walls 43 and subsequently subjected to electroless plating to form electrodes 24 and wiring patterns 25. Further, a top plate 26 and a nozzle plate 28 are bonded to the substrate 42 thus formed with the electrodes 24 and the wiring patterns 25, thereby forming an ink jet printer head 44.

In this preferred embodiment, a dry film 30 is attached to the upper surface of the upper layer 41 formed of a resin, and the upper surface of the upper layer 41 has few microscopic asperities. Accordingly, in performing exposure and development to the dry film 30 to form a pattern resist film 32, there hardly occurs irregular reflection of light for the exposure. As a result, there is no possibility that light irregularly reflected may sensitize a portion of the dry film 30 covered with a resist mask 31, thereby forming the pattern resist film 32 faithfully following a pattern described in the resist mask 31.

Figure 8:
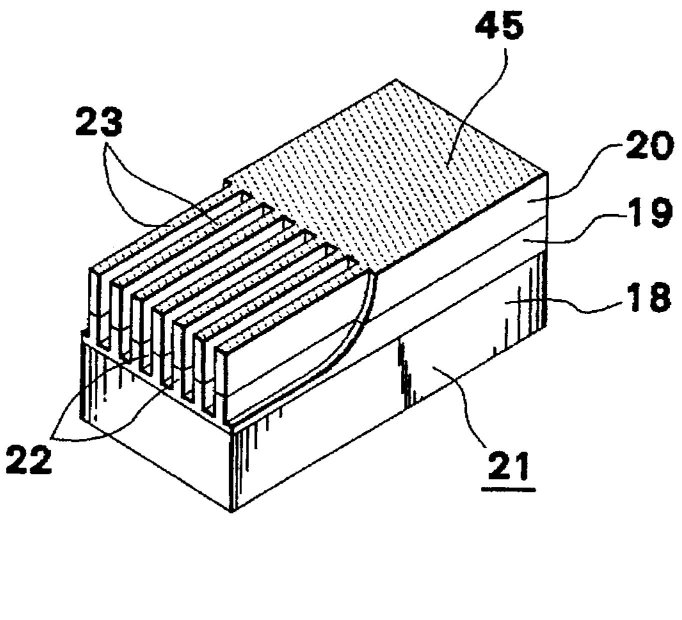
FIG. 8 is a perspective view showing a condition where a liquid resist is applied to a substrate in a fourth preferred embodiment according to the present invention.
Figure 9A:
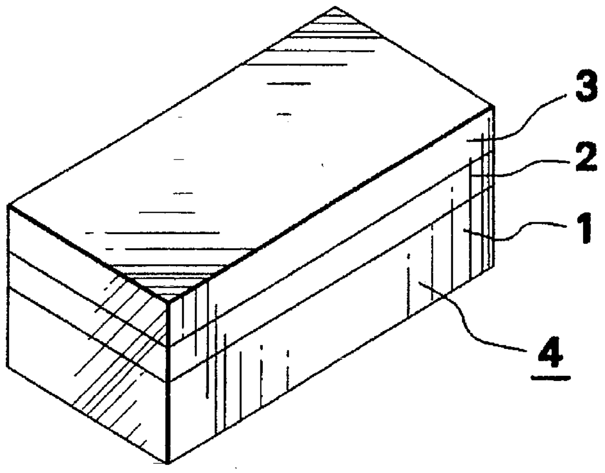
FIG. 9(A) PRIOR ART
FIG. 9(A) is a perspective view of a substrate in manufacturing an ink jet printer head in the prior art.
Figure 9B:
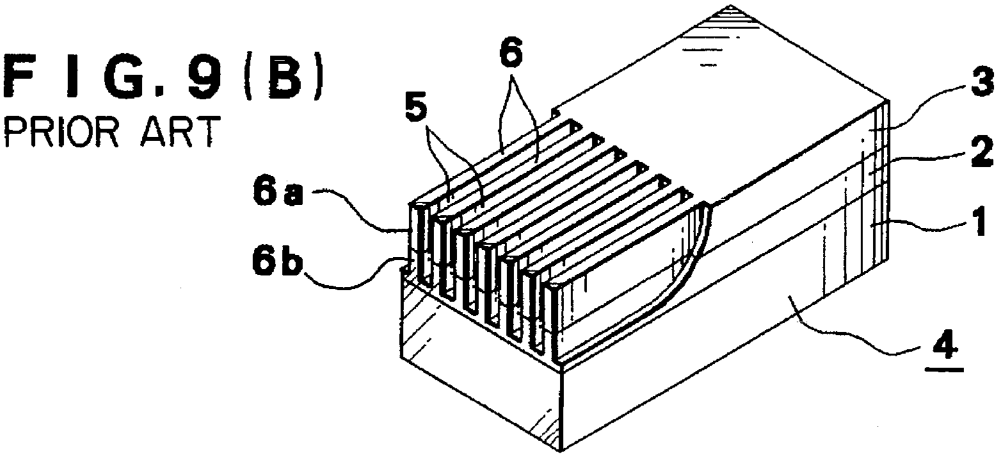
FIG. 9(B) PRIOR ART
FIG. 9(B) is a perspective view showing a condition where the substrate is cut to form channels.
Figure 9C:
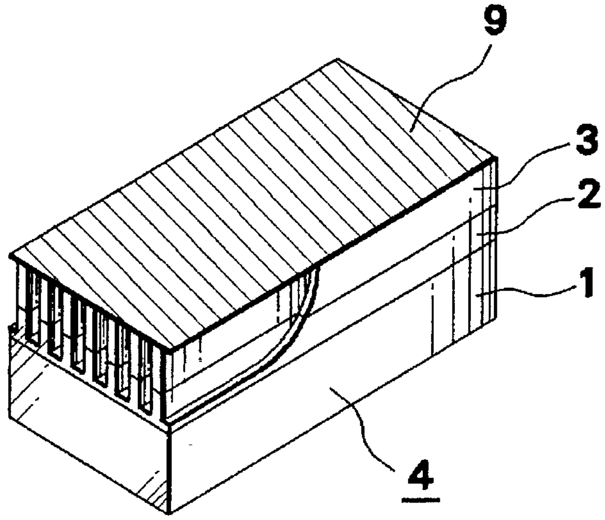
FIG. 9(C) PRIOR ART
FIG. 9(C) is a perspective view showing a condition where a dry film is attached to the upper surface of the substrate.

A fourth preferred embodiment of the present invention will now be described with reference to FIG. 8. In this preferred embodiment, a substrate 21 consists of a bottom plate 18, a lower layer 19, and a piezoelectric member 20. The substrate 21 is cut to form a plurality of channels 22 and side walls 23. Thereafter, a liquid resist 45 is applied to the upper surface of the piezoelectric member 20 by using a spin coater to form a resist layer having a thickness of 2 to 3 μm. Next, a resist mask 31, as shown in FIG. 3(A) for inatance, is placed on the layer of the liquid resist 45, and exposure and development are performed to form a pattern resist film (not shown).

The thickness of the liquid resist 45 can be made smaller than that of the dry film 30 used in the previous preferred embodiments, and even if light for the exposure is irregularly reflected on the asperities of the upper surface of the piezoelectric member 20, the irregularly reflected light is less incident on the liquid resist 45. Accordingly, a portion of the liquid resist 45 masked by the resist mask 31 is hardly sensitized by the light. As a result, the pattern resist film faithfully following a pattern described in the resist mask 31 can be formed.

Having thus described the four preferred embodiments of the present invention, it is to be noted that the present invention is not limited to these preferred embodiments, but various modifications and changes may be made within the scope of the present invention. All modifications and changes that fall within the scope of the claims and its equivalence are intended to be embraced by the claims.

What is claimed is:

1. A manufacturing method for an ink jet printer head, comprising the steps of:

(A) forming a substrate composed of a plurality of layers including at least one piezoelectric member polarized across its thickness;

(B) forming a plurality of parallel channels and a plurality of side walls isolating said channels at given intervals, from an upper surface of said substrate, at least a part of each of said side walls being formed from said piezoelectric member;

(C) forming a pattern resist film on the upper surface of said substrate so that said pattern resist film covers a portion of the upper surface of said substrate except electrode forming portions on inner surfaces of said channels and wiring pattern forming portions on said substrate;

(D) performing a process for adsorption of Pd on said electrode forming portions and said wiring pattern forming portions after forming said pattern resist film, thereby adsorbing said Pd as a catalyst core for electroless plating;

(E) separating said pattern resist film;

(F) immersing said substrate from which said pattern resist film has been separated into a plating liquid to deposit plating on said electrode forming portions and said wiring pattern forming portions, thereby forming electrodes and wiring patterns; and (G) mounting on said substrate a top plate for covering upper openings of said channels and a nozzle plate for covering front openings of said channels to form a plurality of ink chambers.

2. A manufacturing method for an ink jet printer head as recited in claim 1, wherein each of said channels formed in said substrate in said step (B) has a width of 100 μm or more.

3. A manufacturing method for an ink jet printer head as recited in claim 1, wherein said process for adsorption of Pd on said electrode forming portions and said wiring pattern forming portions in said step (D) comprises a sensitizing process of immersing said substrate into a sensitizing liquid to adsorb Sn on said substrate, a first stage of activation process of substituting Ag for said Sn, and a second stage of activation process of substituting said Pd for said Ag.

4. A manufacturing method for an ink jet printer head as recited in claim 3, wherein said sensitizing liquid is a mixture liquid of $SnF_2$+HF.

5. A manufacturing method for an ink jet printer head as recited in claim 3, wherein said sensitizing liquid is a mixture liquid of $HBF_4$+$SnF_2$.

6. A manufacturing method for an ink jet printer head as recited in claim 3, wherein said sensitizing liquid is a mixture liquid of $SnCl_2$+HCl.

7. A manufacturing method for an ink jet printer head as recited in claim 3, wherein said first stage of activation process comprises immersing said substrate on which said Sn has been adsorbed into a solution of $AgNO_3$.

8. A manufacturing method for an ink jet printer head as recited in claim 3, wherein said second stage of activation process comprises immersing said substrate treated by said first stage of activation process into a solution of $PdCl_2$+HCl.

9. A manufacturing method for an ink jet printer head as recited in claim 1, wherein said process for adsorption of Pd on said electrode forming portions and said wiring pattern forming portions in said step (D) comprises a catalyzing process of immersing said substrate into a catalyst liquid to adsorb a complex compound of Pd on said substrate, and an accelerating process of metallizing said complex compound of Pd.

10. A manufacturing method for an ink jet printer head as recited in claim 1, wherein the uppermost layer of said substrate is formed by said piezoelectric member in said step (A), and a liquid resist is applied to the upper surface of said substrate before said step (C).

11. A manufacturing method for an ink jet printer head as recited in claim 1, wherein said substrate is formed by bonding said piezoelectric member as an upper layer through an adhesive layer as a lower layer on a bottom plate in said step (A), and said channels are formed to have a depth reaching the interior of said lower layer, thereby forming said side walls composed of said adhesive layer cured and said piezoelectric member in said step (B).

12. A manufacturing method for an ink jet printer head as recited in claim 1, wherein said piezoelectric member comprises two, upper and lower layers of piezoelectric members bonded together so that the directions of polarization thereof are different from each other in said step (A), and said channels are formed to have a depth reaching the interior of said lower layer of said piezoelectric member, thereby forming said side walls composed of said two layers of said piezoelectric members having the different polarization directions.

13. A manufacturing method for an ink jet printer head as recited in claim 1, wherein said substrate is formed by bonding said piezoelectric member as a lower layer on a bottom plate, and applying an adhesive to an upper surface of said piezoelectric member and curing said adhesive to form an adhesive layer as an upper layer in said step (A), and said channels are formed to have a depth reaching the interior of said lower layer, thereby forming said side walls composed of said piezoelectric member and said adhesive layer cured.

* * * * *

UNITED STATES PATENT AND TRADEMARK OFFICE

CERTIFICATE OF CORRECTION

PATENT NO. : 5,649,346

DATED : July 22, 1997

INVENTOR(S) : Kazushige KATSUUMI, et al.

It is certified that error appears in the above-indentified patent and that said Letters Patent is hereby corrected as shown below:

On the title page, Item [75], the Inventors' names should read:

--Inventors: Kazushige Katsuumi, Shizuoka; Toshio Miyazawa, Mishima; Toshihiro Tsukamoto, Gotenba, all of Japan--

On the title page, Item [73] should read:

--Assignees: Kabushiki Kaisha TEC, Shizuoka; TOSHIBA-EMI LIMITED, Tokyo, both of Japan Signed and Sealed this Twenty-third Day of September, 1997

Attest:

BRUCE LEHMAN

*Attesting Officer*

*Commissioner of Patents and Trademarks*